(12) United States Patent
Roy

(10) Patent No.: US 6,781,169 B2
(45) Date of Patent: Aug. 24, 2004

(54) PHOTODETECTOR WITH THREE TRANSISTORS

(75) Inventor: François Roy, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/075,092

(22) Filed: Feb. 12, 2002

(65) Prior Publication Data

US 2002/0167031 A1 Nov. 14, 2002

(30) Foreign Application Priority Data

Feb. 12, 2001 (FR) .............................................. 01 01880

(51) Int. Cl.$^7$ ............................................ H01L 31/113
(52) U.S. Cl. ...................... 257/292; 257/293; 257/462
(58) Field of Search ................................ 257/292–293, 257/462, 466

(56) References Cited

U.S. PATENT DOCUMENTS

| | | | |
|---|---|---|---|
| 4,242,694 A | | 12/1980 | Koike et al. |
| 4,407,010 A | | 9/1983 | Baji et al. |
| 4,630,091 A | * | 12/1986 | Kuroda et al. ............... 257/446 |
| 4,996,578 A | | 2/1991 | Motojima et al. |
| 5,084,747 A | | 1/1992 | Miyawaki |
| 5,191,399 A | | 3/1993 | Maegawa et al. |
| 5,237,185 A | | 8/1993 | Udagawa et al. |
| 5,268,309 A | | 12/1993 | Mizutani et al. |
| 5,306,931 A | * | 4/1994 | Stevens ....................... 257/223 |
| 5,330,933 A | | 7/1994 | Chan et al. |

(List continued on next page.)

FOREIGN PATENT DOCUMENTS

| | | |
|---|---|---|
| EP | 0 152 353 A1 | 8/1985 |
| EP | 0 223 136 A2 | 5/1987 |
| EP | 1 207 686 A1 | 5/2002 |
| GB | 2 276 512 A | 9/1994 |
| WO | WO 92/15036 A1 | 9/1992 |
| WO | WO 92/16999 A1 | 10/1992 |
| WO | WO 93/04556 A1 | 3/1993 |
| WO | WO 97/20434 A1 | 6/1997 |
| WO | WO 97/35438 A1 | 9/1997 |
| WO | WO 98/49729 A1 | 11/1998 |
| WO | WO 99/57887 A1 | 11/1999 |
| WO | WO 00 52765 | 9/2000 |

OTHER PUBLICATIONS

Patent Abstracts of Japan, vol. 009, No. 061, Mar. 19, 1985 & JP 59 198756 A (Hitachi Seisakusho KK).

(List continued on next page.)

*Primary Examiner*—Allan R. Wilson
(74) *Attorney, Agent, or Firm*—Lisa K. Jorgenson; James H. Morris; Wolf, Greenfield & Sacks, P.C.

(57) ABSTRACT

A monolithic photodetector including a photodiode, a precharge MOS transistor, a control MOS transistor, and a read MOS transistor, the photodiode and the precharge transistor being formed in a same substrate of a first conductivity type, the photodiode including a first region of the second conductivity type formed under a second region of the first conductivity type more heavily doped than the substrate, and under a third region of the second conductivity type, more heavily doped than the first region, the second and third regions being separate, the first region forming the source region of the second conductivity type of the precharge MOS transistor, the second and third regions being connected, respectively, to a fixed voltage and to the gate of the control transistor.

30 Claims, 3 Drawing Sheets

U.S. PATENT DOCUMENTS

| | | |
|---|---|---|
| 5,345,266 A | 9/1994 | Denyer |
| 5,502,488 A | 3/1996 | Nagasaki et al. |
| 5,591,997 A | 1/1997 | Guidash et al. |
| 5,614,744 A | 3/1997 | Merrill |
| 5,621,230 A | 4/1997 | Guidash et al. |
| 5,747,835 A | 5/1998 | Pezzani |
| 5,831,326 A | 11/1998 | Chan et al. |
| 5,859,462 A | 1/1999 | Tredwell et al. |
| 5,881,184 A | 3/1999 | Guidash |
| 5,903,021 A | 5/1999 | Lee et al. |
| 5,926,214 A | 7/1999 | Denyer et al. |
| 5,945,722 A | 8/1999 | Tsuei et al. |
| 5,949,061 A | 9/1999 | Guidash et al. |
| 5,978,025 A | 11/1999 | Tomasini et al. |
| 5,981,932 A | 11/1999 | Guerrieri et al. |
| 5,982,011 A | 11/1999 | Kalnitsky et al. |
| 5,986,297 A | 11/1999 | Guidash et al. |
| 6,019,848 A | 2/2000 | Frankel et al. |
| 6,049,118 A | 4/2000 | Nagano |
| 6,051,447 A | 4/2000 | Lee et al. |
| 6,067,113 A | 5/2000 | Hurwitz et al. |
| 6,069,377 A | 5/2000 | Prentice et al. |
| 6,072,206 A * | 6/2000 | Yamashita et al. ........... 257/292 |
| 6,087,703 A | 7/2000 | Ohta et al. |
| 6,100,551 A | 8/2000 | Lee et al. |
| 6,100,556 A | 8/2000 | Drowley et al. |
| 6,107,655 A | 8/2000 | Guidash |
| 6,127,697 A | 10/2000 | Guidash |
| 6,133,954 A * | 10/2000 | Jie et al. .................. 348/308 |
| 6,150,683 A | 11/2000 | Merrill et al. |
| 6,160,281 A | 12/2000 | Guidash |
| 6,160,282 A | 12/2000 | Merrill |
| 6,188,056 B1 | 2/2001 | Kalnitsky et al. |
| 6,218,656 B1 | 4/2001 | Guidash |
| 6,259,124 B1 | 7/2001 | Guidash |
| 6,352,876 B1 | 3/2002 | Bordogna et al. |
| 6,380,572 B1 * | 4/2002 | Pain et al. ................... 257/292 |
| 2001/0045580 A1 | 11/2001 | Descure |
| 2002/0011638 A1 | 1/2002 | Bordogna et al. |
| 2002/0019070 A1 | 2/2002 | Laurin et al. |
| 2002/0030753 A1 | 3/2002 | Kramer et al. |
| 2002/0051067 A1 | 5/2002 | Henderson et al. |

OTHER PUBLICATIONS

Patent Abstracts of Japan, vol. 009, No. 262 (P–398), Oct. 19, 1985 & JP–A–60 111225 (Matsushita Denki Sangyo KK).

Patent Abstracts of Japan, vol. 1998, No. 03, Feb. 27, 1998 & JP 09 289301 A (Nikon Corp.) Nov. 4, 1997.

Patent Abstracts of Japan, vol. 2000, No. 11, Jan. 2, 2001 & JP 2000 236081 A (Nikon Corp.) Aug. 29, 2000.

Patent Abstracts of Japan, vol. 1998, No. 09, Jul. 31, 1998 & JP 10 098175 A (Toshiba Corp.).

Furumiya M. et al., "High Sensitivity and No–Cross–Talk Pixel Technology For Embedded CMOS Image Sensor" International Electron Devices Meeting 2000. IEDM. Technical Digest, San Francisco, CA, Dec. 10–13, 2000, New York, NY: IEEE, US, Dec. 10, 2000, pp. 701–704.

* cited by examiner

PHOTODETECTOR WITH THREE TRANSISTORS

BACKGROUND OF THE INVENTION

1. Field of the Invention

The present invention relates to the fabrication of monolithic photodetectors or image sensors intended for being used in image pick up devices such as, for example, cameras, camcorders, digital microscopes, or digital photographic cameras. More specifically, the present invention relates to image sensors based on semiconductors including a single storage and photodetection element.

2. Discussion of the Related Art

FIG. 1 illustrates the simplified diagram of such an image sensor. Those skilled in the art should understand that a real device includes a plurality or array of such sensors. An elementary sensor includes, interconnected in series between a high supply rail Vdd and a low reference or ground supply rail GND, an N-channel MOS precharge transistor M1 and a photodiode D. I designates the junction node of photodiode D and of precharge transistor M1.

The sensor also includes two N-channel MOS transistors M2 and M3, in series between high power supply Vdd and an input terminal P of an electronic data processing circuit (not shown). M2 designates hereafter that of the two transistors having a source/drain terminal connected to high supply Vdd. Transistor M3, having a terminal connected to terminal P, forms a read transistor. The gate of transistor M2 is connected to node I. The gate of precharge transistor M1 can receive a precharge signal Rs. The gate of read transistor M3 can receive a read control signal Rd.

FIGS. 2A, 2B, and 2C illustrate, by timing diagrams, the variation along time, respectively, of precharge control signal Rs, of read control signal Rd, and of the voltage level of node I.

It will be considered hereafter that transistors M1 and M3 are on when their gate signal is high (1) and that they are off when this signal is low (0).

An operating cycle of the sensor starts with maintaining in the off state read transistor M3, as illustrated by the low state (0) of read signal Rd in FIG. 2B. Conversely, precharge transistor M1 is on, as indicated by the high state (1) of precharge signal Rs in FIG. 2A. In this state, node I charges to a maximum voltage Vmax which substantially corresponds to value Vdd of the high power supply.

A time t1 at which the precharge state is reached on node I is considered. The precharge control signal is then brought down to its low level, and precharge transistor M1 turns off. From this time t1, node I discharges more or less rapidly according to the lighting of photodiode D.

At a time t2, while precharge transistor M1 is still off, a reading of the cell state is performed by briefly turning on read transistor M3. For this purpose, as illustrated in FIG. 2B, a read signal Rd in the high state is applied on its gate for a short time interval δt centered on time t2. The output level transmitted on terminal P depends on the charge state of the gate of transistor M2, that is, on the voltage at node I and thus on the charge stored at this node. Output P is applied to the input of an electronic processing circuit which provides an indication of the lighting of photodiode D between times t1 and t2.

FIG. 3 illustrates, in a partial simplified cross-section view, a monolithic forming of the assembly of a photodiode D and of precharge transistor M1 of FIG. 1. These elements are formed in a semiconductor substrate 1 of a first conductivity type, for example, of type P, which is lightly doped (P−). This substrate for example corresponds to an epitaxial layer on a P-type silicon wafer (not shown). The active area is delimited by field insulating layers 2, for example made of silicon oxide ($SiO_2$), and corresponds either to a portion of substrate 1, or to a well 3 of the same conductivity type as underlying substrate 1, but more heavily doped. Above the surface of well 3 is formed an insulated gate structure 4 possibly provided with lateral spacers 5. On either side of gate 4, at the surface of well 3, are located heavily-doped source and drain regions 6 and 7 of the opposite conductivity type, for example, N (N+). Source region 6 is formed on a much larger surface area than drain region 7 and forms with underlying substrate 3 the junction of photodiode D. Gate 4, source 6, and drain 7 are integral with metallizations (not shown) that make contact between these regions and precharge control signal Rs, the gate of transistor M2 (node I), and high power supply Vdd, respectively. The structure is generally completed by a heavily-doped P-type region (not shown), which enables connecting, to the reference or ground voltage, substrate 1 and well 3.

FIG. 4 illustrates in full lines the voltage levels of the various regions of FIG. 3 just after the precharge: regions 6 and 7 are at the precharge voltage, well 3 is grounded. Voltage VR of region 6 just before a reading while photons have irradiated this region has been shown in dotted lines. The precharge voltage depends on the biasing of precharge transistor M1, that is, on the level of signal Rs applied on its gate. If transistor M1 is in ohmic operation (very high Rs), regions 6 and 7 are precharged to voltage Vdd. If transistor M1 is in low-inversion operation, the voltages of regions 6 and 7 align on the level of the channel of transistor M1.

A disadvantage of this type of structure is that the maximum voltage of region 6 after the precharge is poorly defined. Indeed, a precharge noise signal having a voltage value given by relation V=kTC, where k is the Boltzman constant, T is temperature, and C is the capacitance of this diode, corresponds to the diode capacitance. This noise must be taken into account by the electronic processing circuit upon evaluation of the output state. Indeed, to be able to determine the voltage decrease due to an irradiation, the value at time t2 (FIG. 2) must be compared to the maximum precharge value. This precharge level being unknown, correlated double-sampling methods which require sampling the maximum value at the end of the precharge have to be implemented. More complex electronic systems must be provided to be able to perform a sampling at the end of the precharge. The data thus obtained must also be stored. It is then necessary to have an additional memory of same size as the total array of the image pick up device, which results in a significant bulk which limits the device miniaturization. Further, the associated electronic processings are relatively long.

SUMMARY OF THE INVENTION

The present invention thus aims at providing a novel elementary cell which enables reducing the processing time.

The present invention also aims at providing such a cell which enables reducing the bulk.

To achieve these and other objects, the present invention provides a photodetector made in monolithic form, of the type including a photodiode, a precharge MOS transistor, a control MOS transistor, and a read MOS transistor, the photodiode and the precharge transistor being formed in a same substrate of a first conductivity type, the photodiode including a first region of the second conductivity type formed under a second region of the first conductivity type, more heavily doped than the substrate, and under a third region of the second conductivity type, more heavily doped than the first region, the second and third regions being separate, the first region forming the source region of the second conductivity type of the precharge MOS transistor, the second and third regions being connected, respectively, to a fixed voltage and to the gate of the control transistor.

According to an embodiment of the present invention, the photodetector further includes a well of the first conductivity type, more heavily doped than the substrate, in which the first region is formed.

According to an embodiment of the present invention, the first conductivity type is type P and the second conductivity type is type N.

According to an embodiment of the present invention, the substrate, the well, and the second region are maintained at a low reference voltage of the circuit.

The foregoing objects, features and advantages of the present invention will be discussed in detail in the following non-limiting description of specific embodiments in connection with the accompanying drawings.

DETAILED DESCRIPTION

Figure 3:
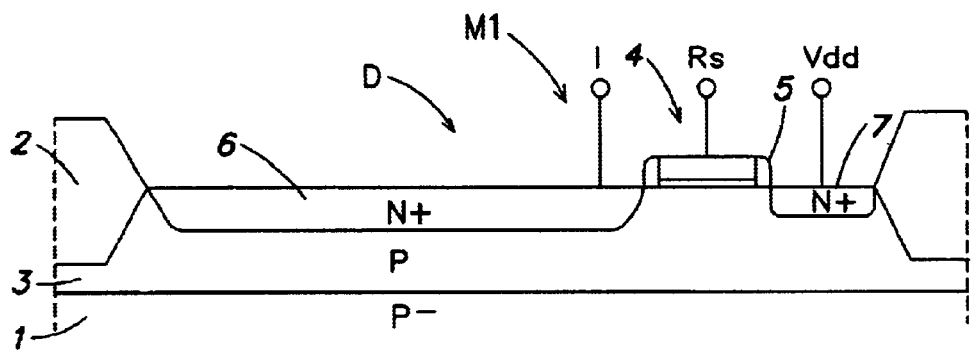
FIG. 3 is a partial simplified cross-section view of a portion of FIG. 1 made in a known monolithic form.
Figure 4:
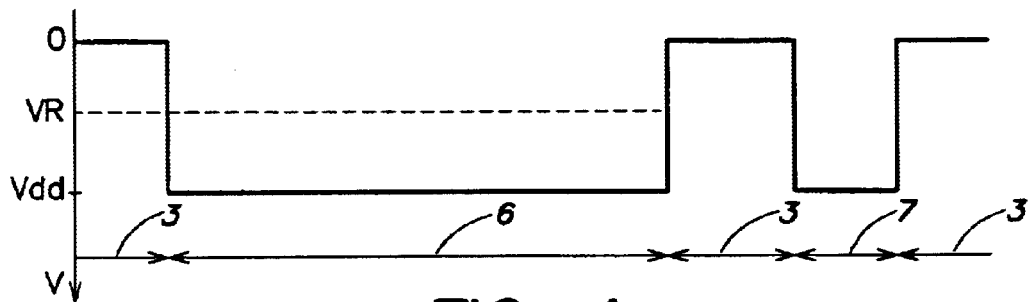
FIG. 4 illustrates voltage levels in the structure of FIG. 3.
Figure 5:
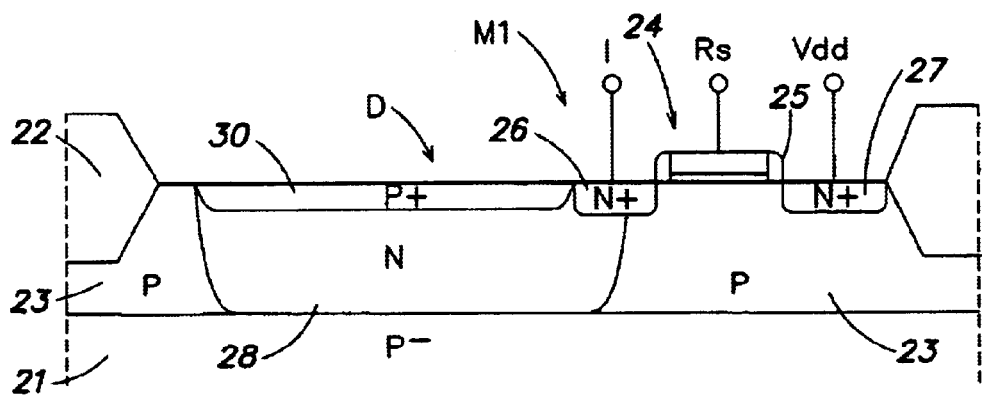
FIG. 5 is a simplified partial cross-section view of a portion of the circuit of FIG. 1 made in another known monolithic form.
Figure 7:
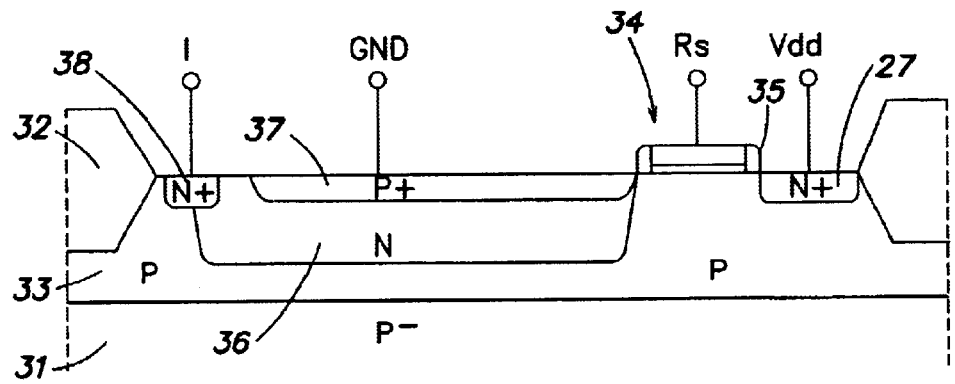
FIG. 7 illustrates in a partial simplified cross-section view the forming of a portion of the circuit of FIG. 1 according to an embodiment of the present invention.
Figure 8:
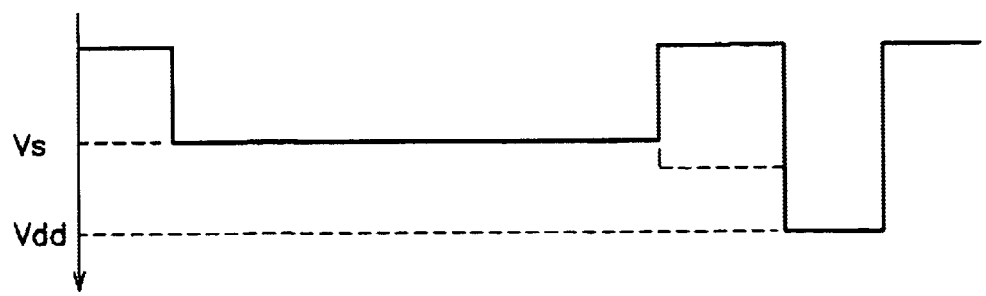
FIG. 8 illustrates voltage levels in the structure of FIG. 7.

Same elements have been designated with the same references in the different drawings and, further, as usual in the representation of integrated circuits, FIGS. 3, 5, and 7 are not drawn to scale.

It has already been provided, for example, in U.S. Pat. No. 6,051,447, which is incorporated herein by reference, to replace the conventional photodiode such as previously described in relation with FIG. 3 by a photodiode of "completely depleted" type.

FIG. 5 illustrates, in a partial simplified cross-section view, a structure of the monolithic implementation of the series association of such a photodiode and of a precharge transistor.

Precharge transistor M1 and completely depleted photodiode D are formed in a lightly-doped semiconductor substrate 21 of a first conductivity type, for example, type P (P−). More specifically, transistor M1 and photodiode D are formed in an active region delimited by field insulation areas 22, for example, silicon oxide. This active area corresponds either to a portion of substrate 21, or to a P-type well 23 formed from the surface of substrate 21, but more heavily doped and relatively deep. At the surface of well 23, to the right of FIG. 5, source and drain regions 26 and 27 of precharge transistor M1 have been formed on either side of an insulated gate structure 24 possibly provided with lateral spacers 25. Source 26 and drain 27 are heavily-doped regions of a conductivity type opposite to that of substrate 21, for example, N (N+). Gate 24, source region 26, and drain region 27 are solid with metallizations (not shown), which are respectively connected to a precharge control circuit which provides precharge signal Rs, to the gate of transistor M2, that is, node I, and to high power supply Vdd.

In the left-hand portion of FIG. 5 is formed an N-type doped region 28, which extends to substrate 21 and is in contact with source region 26. Region 28 is less heavily doped than source 26.

Region 28, outside of its contact with source 26, is covered with a P-type region 30, heavily doped, also in contact with substrate 21 via well 23. Substrate 21 is permanently connected to a low reference supply or circuit ground. Accordingly, during the entire operation of the device, well 23 and region 30 are also maintained at the reference voltage of the circuit.

Typically, region 30 of a thickness of 0.1 $\mu$m includes boron in a concentration of $5.10^{18}$ atoms/cm$^3$, while region 28 of a 0.3 $\mu$m thickness includes phosphorus in a concentration of $10^{18}$ atoms/cm$^3$.

During the precharge, transistor M1 is on and the charges photogenerated in cathode region 28 of the photodiode evacuate via source region 26 to drain region 27. Since anode 30 of the diode is heavily doped and region 28 is relatively thin, the space charge area tends to extend across the entire thickness of region 28, which is completely depleted. The junction capacitance seen from node I is null. Photodiode D behaves as a capacitor having a substantially null capacitance and, during the precharge, region 28 self-biases to a voltage value Vs set only by the relative dopings of region 28 and of surface region 30. This voltage is thus theoretically no longer affected by supply noise.

Figure 6:
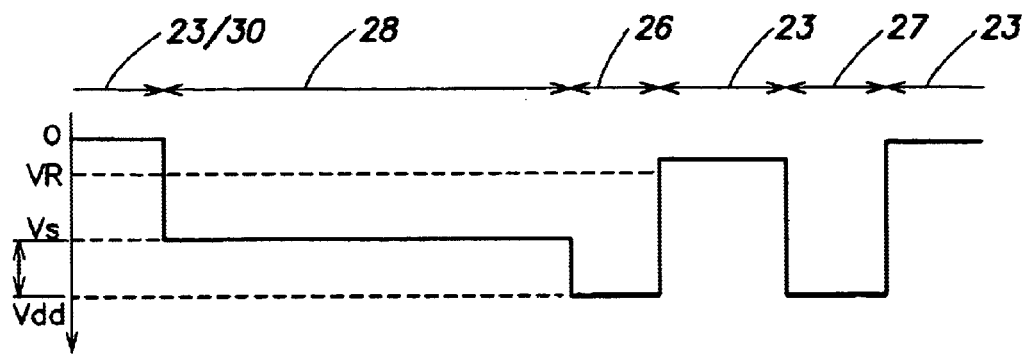
FIG. 6 illustrates voltage levels in the structure of FIG. 5.

FIG. 6 illustrates the voltages in the different regions of FIG. 5. The same conditions as in FIG. 3 are considered. The behavior of well 23 and of source and drain regions 26 and 27 is not modified. In region 28, the voltage of the photodiode is at most Vs, which is a fixed precharge value, smaller than the value of high power supply Vdd.

A disadvantage of this structure is the potential difference between source region 26 and cathode region 28 of the photodiode. Indeed, after the precharge step, during a lighting, the storage of the photogenerated charges starts in the region having the highest voltage, that is, in source region 26, before taking place in cathode region 28. In the subsequent reading, as illustrated in FIG. 7E of the above-mentioned Kodak patent, everything occurs, as seen from node I, as if two successive capacitances would discharge. Then, there is a non-linearity of the gate control signal of control transistor M2. This non-linearity of the control signal translates as a non-linearity of the output signal provided to input terminal P of the processing circuit. In the case of color sensors, the restitution of the different colors is shifted, which makes a direct display impossible. In the case of black and white sensors, the contrast is particularly low.

Further, as previously, source region 26 is affected by a variable precharge noise having a voltage value provided by the preceding relation V=kTC.

These stray capacitance effects are further enhanced due to the metallization of connection of region 26 to node I.

The present invention thus aims at providing a novel structure which enables overcoming the above-described disadvantages.

FIG. 7 illustrates, in a partial simplified cross-section view, a monolithic forming of a photodiode according to the present invention associated with a precharge transistor.

Figure 1:
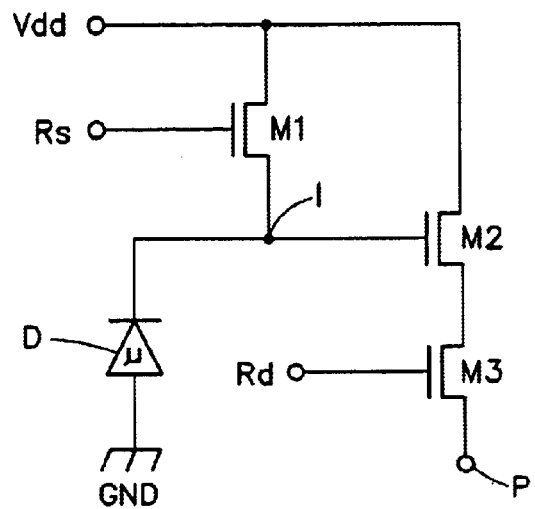
FIG. 1 is a schematic diagram of an image sensor.
Figure 2A:
FIGS. 2A, 2B, and 2C are timing diagrams which illustrate the state of different signals during an operating cycle of the cell of FIG. 1.
Figure 2B:
Figure 2C:
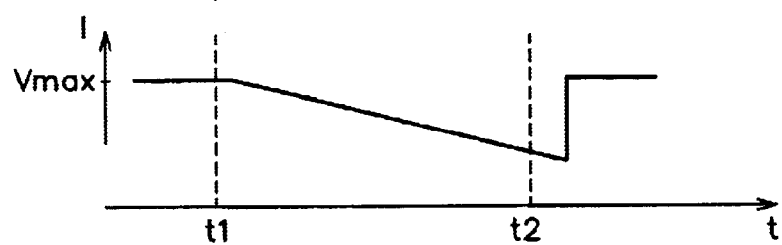

Precharge transistor M1 (FIG. 1) and photodiode D according to the present invention are made in a lightly-doped semiconductor substrate 31 of a first conductivity type, for example, type P (P−). More specifically, transistor M1 and photodiode D are formed in an active region delimited by field insulating regions 32, for example, silicon oxide (SiO2). This active area corresponds either to a portion of substrate 1, or to a P-type well 33 formed from the surface of substrate 31, but more heavily doped and relatively deep. At the surface of well 33, to the right of FIG. 7, source and drain regions 36 and 27 of precharge transistor M1 have been formed on either side of an insulated-gate structure 34 (gate of transistor M1), possibly provided with lateral spacers 35. Source 36 and drain 27 are regions having a conductivity type opposite to that of substrate 31, for example, N. Drain 27, shown to the right of gate 34, is heavily doped (N+) and is integral with a metallization not shown, connected to high supply Vdd. Gate 34 is integral with another metallization not shown, connected to a precharge control circuit which provides precharge signal Rs. Source 36 of transistor M1, shown to the left of gate 34, is a more lightly-doped region, deeper and having a much larger surface area than drain 27. Source 36 forms the cathode of photodiode D. Photodiode D is of completely depleted type and region 36 includes a P-type surface region 37, shallow and heavily doped (P+). Region 37 is connected, outside of the shown region, to reference supply GND. Source 36 also includes a second surface region 38 separate from region 37. Region 38 is doped of the same conductivity type as region 36, for example N, but more heavily (N+). Region 38 is only intended for ensuring a strongly conductive contact with a metallization (not shown) enabling connection of source 36 to node I. Region 38 is formed apart from the channel region of precharge transistor M1, underlying gate 34 thereof. The dimensions of region 38 can accordingly be reduced to the bare lithographically possible minimum. Region 38 thus has dimensions clearly reduced with respect to drain region 27.

In precharge operation, or at the end of a read operation, region 36 and region 38 altogether uniformly self-bias to the quiescent value or depletion voltage Vs of photodiode D.

Such a depletion voltage Vs is perfectly defined by the sole manufacturing conditions of the component and remains perfectly stable in operation. Accordingly, the value reached at the end of each precharge is perfectly stabilized. Previously-described precharge noise kTC is thus advantageously eliminated.

This enables simplifying the electronic data processing. Indeed, the precharge value of the source of transistor M1 being perfectly stabilized, it is no longer necessary to compare the read state to a stored value at the end of the precharge, to perform a double correlation. This reduces the processing time and thus increases the possible pick up frequency.

An advantage further is that it is no longer necessary to have an array for storing the intermediary data. The system bulk is thus reduced. This enables reducing the dimensions of the general device or increasing the dimensions of the measurement array on a long-term basis. An increase in dimensions enables increasing the device responsiveness.

Of course, the present invention is likely to have various alterations, modifications, and improvements which will readily occur to those skilled in the art. In particular, those skilled in the art will know how to adjust the doping levels and types to the desired performances and to the materials used according to the constraints of a specific manufacturing technology.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A monolithic photodetector including a photodiode, a precharge MOS transistor, a control MOS transistor, and a read MOS transistor, the photodiode and the precharge transistor being formed in a same substrate of a first conductivity type, wherein the photodiode includes a first region of a second conductivity type formed under a second region of the first conductivity type more heavily doped than the substrate, and under a third region of the second conductivity type, more heavily doped than the first region, the second and third regions being separate, the first region forming a source region of the second conductivity type of the precharge MOS transistor, the second and third regions being connected, respectively, to a fixed voltage and to a gate of the control transistor.

2. The photodetector of claim 1, further including a well of the first conductivity type, more heavily doped than said substrate, in which the first region is formed.

3. The photodetector of claim 1, wherein the first conductivity type is type P and the second conductivity type is type N.

4. The photodetector of claim 2, wherein the substrate, the well, and the second region are maintained at a low reference voltage of the circuit.

5. The photodetector of claim 1, wherein the third region is spaced from a channel region of the precharge transistor.

6. The photodetector of claim 1, wherein a cathode of the photodiode includes the first region.

7. The photodetector of claim 1, wherein the photodiode is a fully-depleted-channel type of photodiode.

8. The photodetector of claim 1, wherein the third region is operable to maintain a stable quiescent voltage during operation of the photodetector.

9. The photodetector of claim 1, wherein the first region is operable to maintain a same stable quiescent voltage during operation of the photodetector as the third region.

10. The photodetector of claim 1, wherein the first conductivity type is N-type and the second conductivity type is P-type.

11. The photodetector of claim 2, wherein the well and the first region form a junction of the photodiode.

12. An apparatus, comprising:
a substrate of a first conductivity type;
a transistor including a channel region of the first conductivity type and a first region of a second conductivity type disposed over the substrate, the first region serving as a source region of the transistor; and
a photodiode including the first region, a second region of the first conductivity disposed over the first region and a third region of the second conductivity type disposed over the first region and spaced from the channel region,
wherein the substrate and the second region are connected to a low reference voltage of the apparatus.

13. The apparatus of claim 12, wherein the transistor is a precharge transistor.

14. The apparatus of claim 13, wherein the precharge transistor is a MOS transistor.

15. An apparatus, comprising:

a substrate of a first conductivity type;

a transistor including a channel region of the first conductivity type and a first region of a second conductivity type disposed over the substrate, the first region serving as a source region of the transistor;

a photodiode including the first region, a second region of the first conductivity disposed over the first region and a third region of the second conductivity type disposed over the first region and spaced from the channel region;

a control transistor having a gate connected to the third region, a first terminal connected to a supply voltage and a second terminal; and a read transistor having a gate connected to an input signal, a third terminal connected to the second terminal, and a fourth terminal connected to processing circuitry, wherein the transistor is a precharge transistor.

16. The apparatus of claim 15, wherein each of the read transistor, control transistor and the precharge transistor is a MOS transistor.

17. The apparatus of claim 15, further comprising:

a metallization over the third region that connects the third region to the gate of the control transistor.

18. The apparatus of claim 12, wherein the third region is spaced from the second region.

19. The apparatus of claim 12, wherein the second region is more heavily doped than the substrate.

20. The apparatus of claim 12, wherein the third region is more heavily doped than the first region.

21. The apparatus of claim 12, further comprising:

a well of the first conductivity type, in which the first region is formed.

22. The apparatus of claim 21, wherein a junction of the well and the first region forms a junction of the photodiode.

23. The apparatus of claim 21, wherein the well is more heavily doped than the substrate.

24. An apparatus, comprising:

a substrate of a first conductivity type;

a transistor including a channel region of the first conductivity type and a first region of a second conductivity type disposed over the substrate, the first region serving as a source region of the transistor;

a photodiode including the first region, a second region of the first conductivity disposed over the first region and a third region of the second conductivity type disposed over the first region and spaced from the channel region; and a well of the first conductivity type, in which the first region is formed, wherein the well is more heavily doped than the substrate, and wherein the second region is more heavily doped than the well.

25. The apparatus of claim 12, wherein a junction of the first region and the substrate forms a junction of the photodiode.

26. The apparatus of claim 12, wherein the photodiode is a fully-depleted-channel type of photodiode.

27. The apparatus of claim 12, wherein the third region is operable to maintain a stable quiescent voltage during operation of the apparatus.

28. The apparatus of claim 27, wherein the first region is operable to maintain a same stable quiescent voltage during operation of the apparatus as the third region.

29. The apparatus of claim 12, wherein the first conductivity type is N-type and the second conductivity type is P-type.

30. The apparatus of claim 12, wherein the first conductivity type is P-type and the second conductivity type is N-type.

* * * * *